(12) United States Patent
Su et al.

(10) Patent No.: US 6,469,319 B1
(45) Date of Patent: Oct. 22, 2002

(54) OHMIC CONTACT TO A II-VI COMPOUND SEMICONDUCTOR DEVICE AND A METHOD OF MANUFACTURING THE SAME

(75) Inventors: Yan-Kuin Su, Tainan (TW); Shoou-Jinn Chang, Tainan (TW); Wen-Rui Chen, Tainan (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/531,364

(22) Filed: Mar. 21, 2000

(30) Foreign Application Priority Data

Dec. 4, 1999 (TW) .......................... 88121240 A

(51) Int. Cl.[7] .......................... H01L 29/22; H01L 33/00; H01L 23/48
(52) U.S. Cl. .......................... 257/78; 257/103; 257/744; 438/22
(58) Field of Search .......................... 257/78, 762, 751, 257/441, 442, 614, 743, 744, 745, 763, 764, 750, 766, 13, 81, 86, 94, 99; 438/22, 35, 24, 602, 604, 607

(56) References Cited

U.S. PATENT DOCUMENTS

| 4,927,773 A | * | 5/1990 | Jack et al. ..................... 437/22 |
| 5,523,623 A | * | 6/1996 | Yanagihara et al. ......... 257/745 |
| 5,574,296 A | * | 11/1996 | Park et al. ................... 257/103 |

* cited by examiner

Primary Examiner—Tom Thomas
Assistant Examiner—Donghee Kang
(74) Attorney, Agent, or Firm—Fish & Richardson P.C.

(57) ABSTRACT

An ohmic contact to II-VI compound semiconductor device for lowering the contact resistance and increasing the efficiency and reliability of a photoelectric device. The method of manufacturing the ohmic contact to a II-VI compound semiconductor device comprises the steps of forming a II-VI compound semiconductor layer on the substrate, forming a mask layer with a contact via on the II-VI compound semiconductor layer, forming a metal-contact layer on the mask layer and II-VI compound semiconductor layer, and removing the metal-contact layer over the mask layer, wherein the remainder of the metal-contact layer forms the ohmic contact. In order to prevent oxidization of the metal-contact layer, a shield layer comprised of a noble metal can be disposed on the metal-contact layer.

5 Claims, 6 Drawing Sheets

OHMIC CONTACT TO A II-VI COMPOUND SEMICONDUCTOR DEVICE AND A METHOD OF MANUFACTURING THE SAME

DESCRIPTION OF THE INVENTION

1. Field of the Invention

This invention relates to an ohmic contact to a II-VI compound semiconductor device. and its manufacturing method, particularly an ohmic contact to p-type zinc selenium and the method of manufacturing the same.

2. Description of Prior Art

In recent years, II-VI compound semiconductors made of zinc selenium (hereinafter referred to as ZnSe) based materials with wide band gap have been extensively applied in the field of photonics devices, such as photo-detectors, light emitting diodes (LEDs) and semiconductor laser diodes (LDs), etc. Due to a band gap of 2.67 eV at room temperature, the development of blue-green ZnSe-based light emitting device has made considerable progress. Thus, improvement in the low ohmic contacts to these devices becomes increasingly important. Hasse et al. of 3M succeeded in achieving pulsed operation of a II-VI blue-green LD. However, it is difficult to achieve heavy doping in p-type II-VI compound semiconductors. Further, no suitable metal has been found to form good ohmic contacts to II-VI compound semiconductors, and thus Schottky devices must be used.

In view of the large valence band gap, several methods have been proposed to form a good ohmic contact. One method is to find a metal with suitable work function. Namely, n-type semiconductors require metal with low work function and p-type semiconductors require metal with high work function. For ZnSe-based materials with wide band gap, no metal has been found. A second method is to form a heavy doping layer on the surface of the semiconductor, which lowers the Schottky barrier height between the metal and semiconductor. Thus, the carrier can easily tunnel through the shield and improved ohmic behavior is achieved. When $n^+$-type ZnSe is doped by the $ZnCl_2$, it shows improved ohmic behavior.

Fan et al. have obtained a good ohmic contact to p-type ZnSe:N by using a ZnSe/ZnTe multilayer structure for a contact layer to achieve a graded band gap effect; Mensz et al. used a BeTe/ZnSe multilayer structure for a contact layer to achieve a graded band gap effect from p-type ZnSe to p-type BeTe. However, the Be cell must be heated over 1000° C., which is difficult. If the epitaxial growth is done by molecular beam epitaxy (MBE), the growth temperature could be about 280° C.~300° C. In addition, an optimized contact structure provided by Sony Corp is the ZnSe/ZnTe superlattice. However, it requires much more effort to prepare such a complex superlattice structure compared with a simple metal deposition.

SUMMARY OF THE INVENTION

It is an object of the present invention to solve the above mentioned problems by providing an ohmic contact to a p-type II-VI compound semiconductor and obtain a contact resistance as low as the order of $10^{-5} \Omega\text{-cm}^2$. This invention provides a new manufacturing process which forms a metal layer onto p-type or n-type II-VI compound semiconductor to form a good ohmic contact. Further, in order to prevent the metal from oxidizing, a noble metal layer can be formed on the top of the metal layer as a shield layer

DESCRIPTION OF THE PREFERRED EMBODIMENTS

In the ohmic contact to II-VI compound semiconductor device of present invention, a II-VI compound semiconductor layer is formed onto a substrate, and then a metal contact layer is deposited onto a predetermined portion of the II-VI compound semiconductor layer. A shield layer is further deposited on the metal contact layer in order to prevent oxidation.

The First Embodiment

Figure 1:
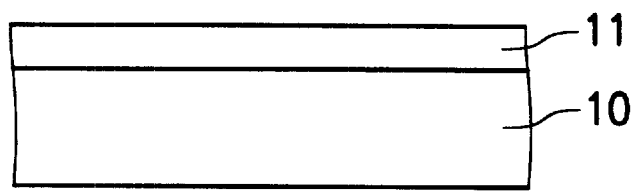
FIG. 1 is a schematic sectional view of p-type ZnSe semiconductor with a GaAs substrate.

As FIG. 1 shows, a II-VI compound semiconductor layer is formed onto a substrate. In this embodiment of the present invention, the above-described substrate is GaAs 10, which is cleaned by organic solvent and then dried by blowing nitrogen. The II-VI compound semiconductor layer 11 is a p-type ZnSe semiconductor layer and can be grown by Molecular Beam Epitaxy (MBE) . Under the conditions of $10^{-10}$ torr and 580° C., arsenic oxide on the GaAs substrate is removed, and then the temperature is decreased to 280° C. Further, a p-type ZnSe semiconductor layer 11 is formed on the GaAs 10 substrate. After forming a layer of p-type ZnSe, the wafer is cleaned by using organic solvent, such as acetone, and then dried by blowing with nitrogen. Furthermore, the wafer is dipped in the solution of hydrofluoric acid ($HF:H_2O=6:1$) for several minutes, for example 5 minutes, in order to remove the oxide of the wafer surface.

Figure 2A:
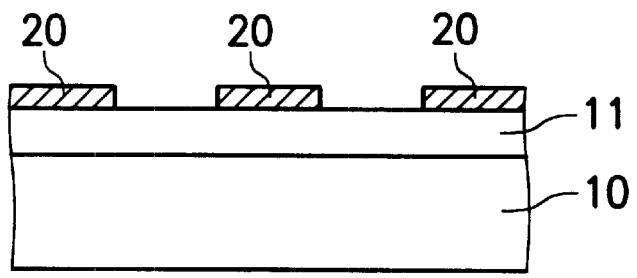
FIG. 2A is a schematic sectional view of a photoresist layer formed on a p-type ZnSe semiconductor layer.
Figure 2B:
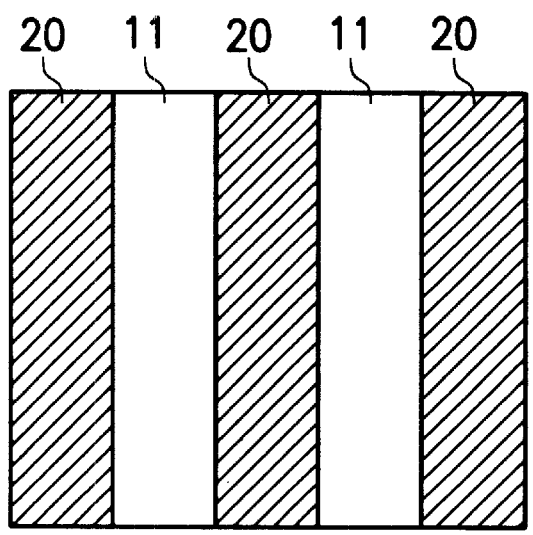
FIG. 2B is a plane view of photoresist structure applied on the surface of p-type ZnSe.

As FIG. 2A and 2B show, the mask layer with a contact via is formed on the p-type ZnSe semiconductor layer 11. In the first embodiment of the present invention, the mask layer with a contact via is formed by photolithography, and finally the photoresist pattern 20 is formed.

Figure 3:
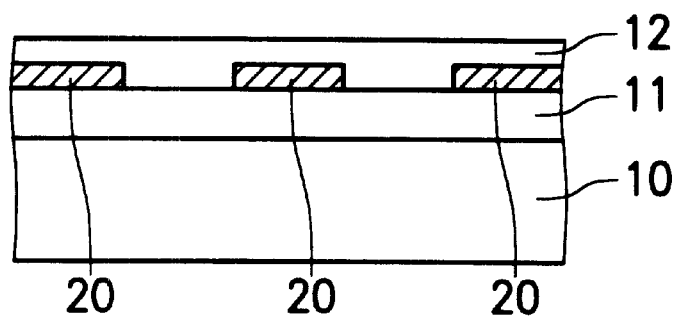
FIG. 3 is a schematic sectional view showing CuGe formed on the surface of p-type ZnSe.

As FIG. 3 shows, a metal-contact layer formed on the II-VI compound semiconductor layer and the mask layer. An alloy of copper and germanium forms the metal-contact layer.

Although the ratio of the copper to germanium could be any value, the preferred ratio of Cu to Ge is 2.6:1. The CuGe is formed on the surface of both the p-type ZnSe semiconductor layer 11 and mask layer 20 by e-beam Evaporator to form a metal-contact layer. The pressure of the chamber of the e-beam Evaporator is exhausted to about $10^{-6}$torr, and then a CuGe film 12 of thickness 800 angstrom unit (a.u.) is formed on the surface of both the p-type ZnSe semiconductor layer 11 and mask layer 20. Note that, the sublimating point of Cu is 2582° C. and the sublimating point of Ge is 2830° C.

Figure 4:
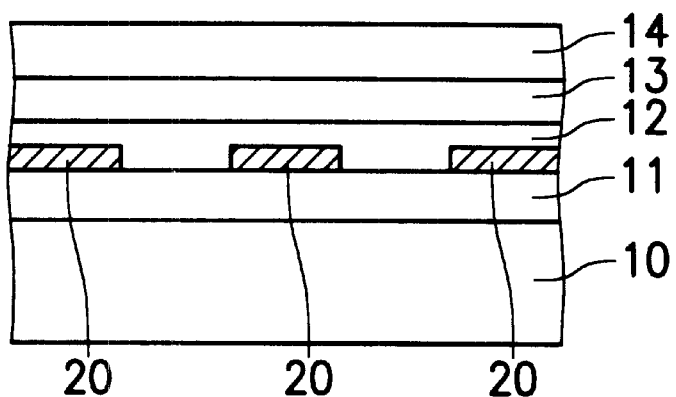
FIG. 4 is a schematic sectional view showing the thin films of Au and Pt formed on the surface of CuGe.

As FIG. 4 shows, a shield layer is formed on the metal-contact layer to prevent oxidation of the metal-contact layer. The material of the shield layer adopts noble metal, such as platinum (Pt), aurum (Au), wolfram (W), etc. In the first embodiment of the present invention, a Pt film 13 of thickness 500 a.u. is formed on the surface of the CuGe12. Next, a Au film 14 of thickness 1000 a.u. is formed on the surface of Pt film 13. Pt film 13 and Au film 14 prevent oxidation of the metal-contact layer.

Figure 5A:
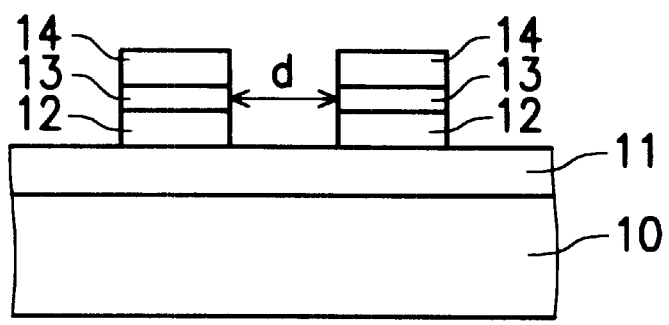
FIG. 5A is a schematic sectional view according to the first embodiment of present invention.
Figure 5B:
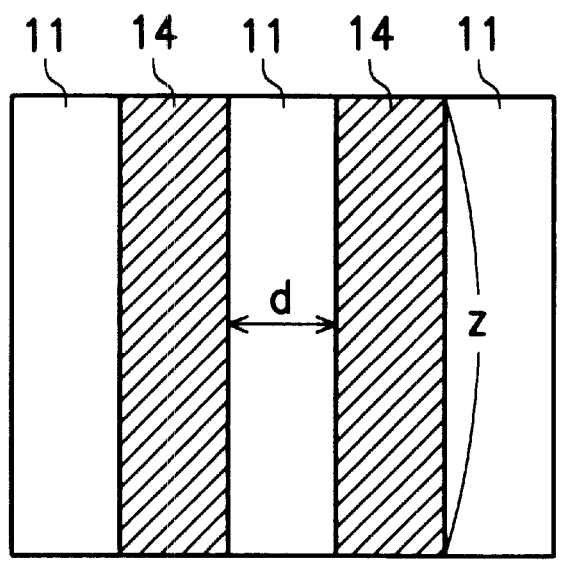
FIG. 5B is a plane view diagram according to the first embodiment of the present invention.

As FIG. 5A and 5B show, some portions of the metal films are lifted-off in order to form the ohmic contact structure. FIG. 5A is the sample configuration of the first embodiment of the present invention. The sample is dipped in the acetone solvent, and shaken by an ultrasonic machine. The metal films are lifted-off, thus forming the ohmic contact structure. Next, a HP-4156 semiconductor parameter analyzer is used to measure the current-voltage (I-V) characteristic of the sample and the transmission line method (TLM) is used to determine the specific ohmic contact value.

The second embodiment

Figure 6:
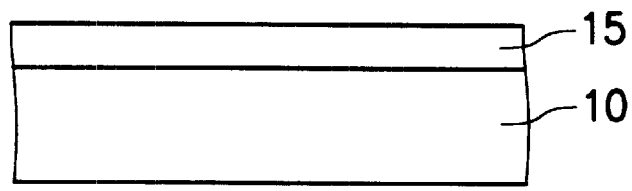
FIG. 6 is a schematic sectional view of n-type ZnSe semiconductor with a GaAs substrate.

As FIG. 6 shows, a II-VI compound semiconductor layer is formed onto a substrate. In the second embodiment of present invention, the above-described substrate is GaAs 10, which is cleaned by organic solvent and then dried by blowing with nitrogen. The II-VI compound semiconductor layer is an n-type ZnSe semiconductor layer 15 and can be grown by Molecular Beam Epitaxy (MBE). An n-type ZnSe semiconductor layer 15 is formed on the GaAs 10 substrate. After forming a layer of n-type ZnSe, the wafer is cleaned using organic solvent, such as acetone, and then dried by blowing nitrogen. Furthermore, the wafer is dipped in a solution of hydrofluoric acid (HF:$H_2O$=6:1) for several minutes, for example 5 minutes, in order to remove the oxide of the surface of the n-type ZnSe semiconductor layer 15.

Figure 7A:
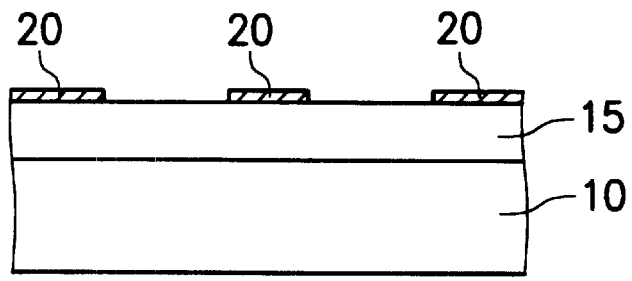
FIG. 7A is a schematic sectional view of a photoresist layer formed on an n-type ZnSe semiconductor layer.
Figure 7B:
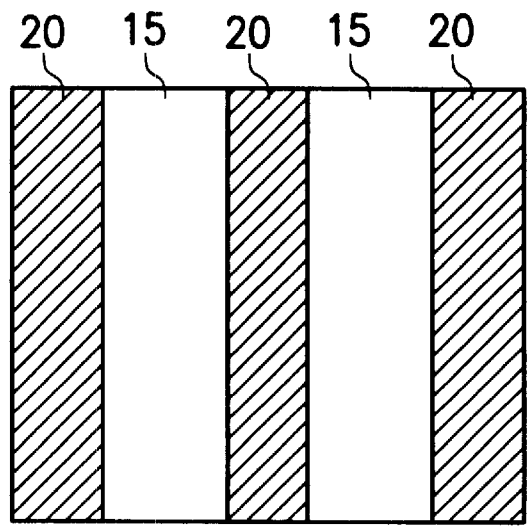
FIG. 7B is a plane view of photoresist structure applied on the surface of n-type ZnSe.

As FIG. 7A and 7B show, a mask layer with a contact via is formed on the n-type ZnSe semiconductor layer 15. In the second embodiment of the present invention, the mask layer with a contact via is formed by photolithography, and finally a photoresist pattern 20 is formed on the surface of n-type ZnSe.

Figure 8:
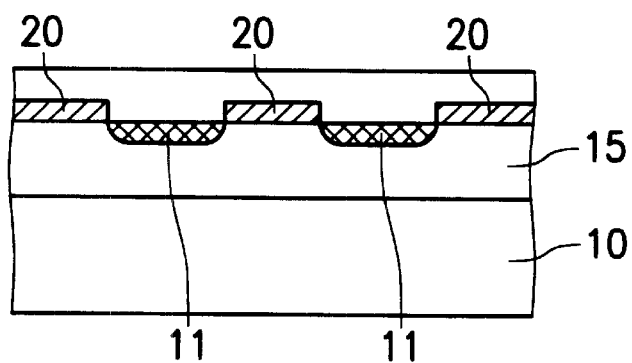
FIG. 8 illustrates the configuration of CuGe, which is deposited onto the surface of n+-ZnSe so as to form the p-type ZnSe.

As FIG. 8 shows, a metal-contact layer is formed on the II-VI compound semiconductor layer and the mask layer. The metal-contact layer is an alloy of copper and germanium.

Although the ratio of the copper to germanium could be any value, the preferred ratio of Cu to Ge is 3:1. The CuGe is formed on the surface of both the n-type ZnSe semiconductor layer 15 and mask layer 20 by e-beam Evaporator and formed a metal-contact layer. The pressure of the chamber of the e-beam Evaporator is exhausted to about $10^{-6}$torr, and then a CuGe film 12 of thickness 800 a.u. is formed on the surface of both the n-type ZnSe semiconductor layer 15 and mask layer 20. The CuGe film 12 reverses the contiguous areas of the n-type ZnSe semiconductor layer 15 to p-type ZnSe semiconductor layer 11.

Figure 9:
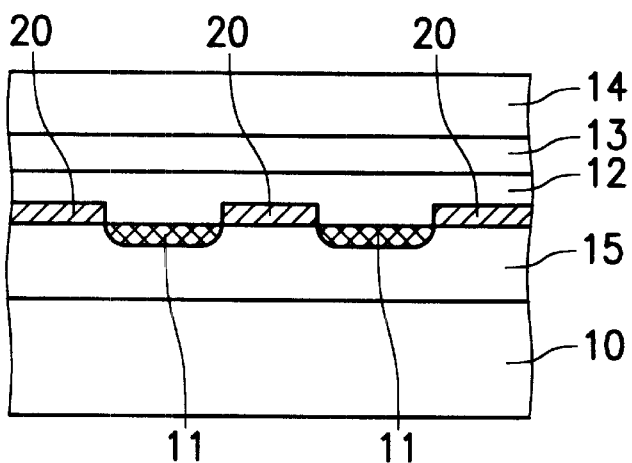
FIG. 9 is a schematic sectional view of Pt/Au formed onto the surface of CuGe.

As FIG. 9 shows, a shield layer is formed on the metal-contact layer to prevent oxidation of the metal-contact layer. The material of the shield layer is a noble metal, such as platinum (Pt), aurum (Au), wolfram (W), etc. In the second embodiment of the present invention, a Pt film 13 of thickness 500 a.u. is formed on the surface of the CuGe12. Next, an Au film 14 of thickness 1000 a.u. is formed on the surface of Pt film 13. The Pt film 13 and Au film 14 prevent the oxidation of the CuGe12.

Figure 10:
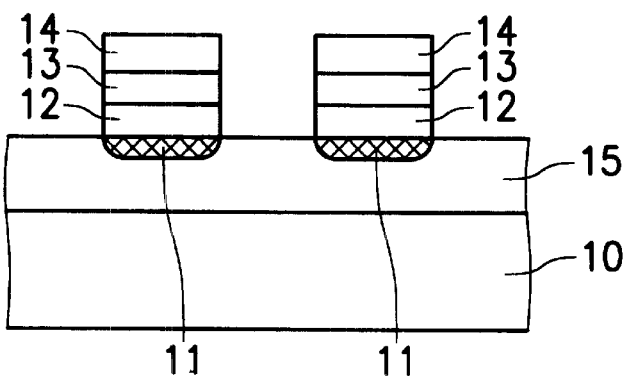
FIG. 10 is a schematic sectional view according to the second embodiment of present invention.

As FIG. 10 shows, some portions of the metal films are lifted-off in order to form the ohmic contact structure. FIG. 10 is the sample configuration of the second embodiment of the present invention. The sample is dipped in the acetone solvent, and shaken by the ultrasonic machine. The metal films are lifted-off, thus forming the ohmic contact structure. Further, an HP-4156 semiconductor parameter analyzer is used to measure the current-voltage (I-V) characteristic of the sample and the transmission line method (TLM) is used to determine the specific ohmic contact value.

Experiments

The specific ohmic contact value is determined by Transmission Line Method (TLM). The HP-4156 semiconductor parameter analyzer is used to measure the current-voltage (I-V) characteristic of the samples, and then specific contact resistance is determined by TLM. Samples were generated by using the above-described methods of the invention. All the samples measured by the HP-4156 show the ohmic contact (i.e. linear I-V curve), and the resistance is calculated based the slope of the I-V curve. According to literature, the formula of TLM is listed below.

$$\Delta V = i_0 R_s \left[ \frac{d}{Z} + \frac{2L_T}{Z} \right]$$

The above formula with reference to FIG. 5A and 5B gives an accurate contact resistance value, wherein d represents the gap between the contact layers; Z represents the length of the electrode (i.e. the contact layer); $R_S$ represents the sheet resistance; $L_T$ represents the transfer length; and $R_C$ represents the contact resistance.

Figure 11:
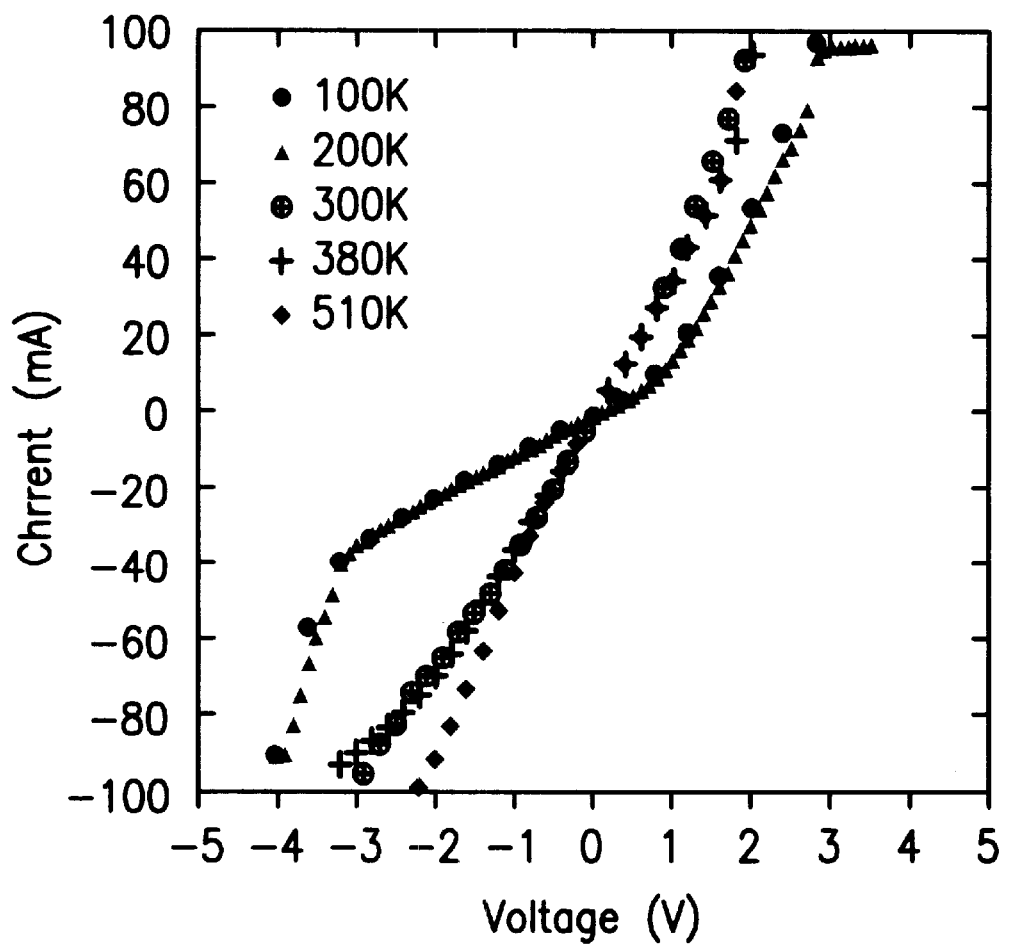
FIG. 11 is an I-V curve off p-type ZnSe, which is varied with temperature, deposited by CuGe/Pt/Au.

As FIG. 11 shows, the I-V curve varies with temperature. The value of the contact resistance calculated by the TLM formula is about $2 \times 10^{-5} \Omega cm^2$ when the temperature is 300K (i.e. room temperature). Because the univalent Cu of CuGe takes the place of $Zn^{2+}$ at the interface between CuGe film and ZnSe semiconductor layer, a heavily doped $p^+$-type ZnSe semiconductor layer is formed therebetween. The conduction process by tunneling carriers forms a good ohmic contact.

It is understood that the embodiments of present invention are not restricted to II-VI compound semiconductor to ZnSe only. The II-VI compound semiconductors are comprised of group II and group VI, wherein group II includes Zn, Cd, Mg, etc. and group VI includes S, Se, etc., to form a chemical composition, such as ZnSe, CdSe, ZnSSe, ZnMgS, ZnCdSSe etc.

In the first embodiment of present invention, the p-type II-VI semiconductor could originally have an intrinsic II-VI semiconductor which is then doped with a pentad, such as nitrogen (N).

In the second embodiment of present invention, the n-type II-VI semiconductor could originally have an intrinsic II-VI semiconductor which is then doped with a heptad, such as chlorine (Cl).

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An ohmic contact to a II-VI compound semiconductor device, which is suitable for a semiconductor substrate, comprising:

a II-VI compound semiconductor layer formed on the substrate, wherein said II-VI compound semiconductor is an n-type II-VI semiconductor; and a metal-contact layer formed on a predetermined portion of said II-VI compound semiconductor layer, wherein said metal-contact layer is an alloy of Cu and Ge and said predetermined portion of said II-VI compound semiconductor layer is a p-type II-VI semiconductor layer.

2. An ohmic contact to II-VI compound semiconductor device according to claim 1, wherein said II-VI compound semiconductor layer is a p-type II-VI compound semiconductor layer.

3. An ohmic contact to II-VI compound semiconductor device according to claim 1, further including a shield layer disposed on said metal-contact layer.

4. An ohmic contact to II-VI compound semiconductor device according to claim 3, wherein said shield layer includes at least one noble metal layer.

5. An ohmic contact to II-VI compound semiconductor device according to claim 1, wherein said II-VI compound semiconductor layer is a ZnSe semiconductor layer.

* * * * *